(12) United States Patent
Yu

(10) Patent No.: US 6,972,594 B2
(45) Date of Patent: Dec. 6, 2005

(54) LEVEL-SHIFTING CIRCUIT

(75) Inventor: Jian-Shen Yu, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 79 days.

(21) Appl. No.: 10/615,464

(22) Filed: Jul. 7, 2003

(65) Prior Publication Data

US 2004/0183568 A1 Sep. 23, 2004

(30) Foreign Application Priority Data

Mar. 17, 2003 (TW) .............................. 92105774 A

(51) Int. Cl.[7] .................. H03K 19/0175; H03K 19/094
(52) U.S. Cl. .......................................... 326/68; 326/83
(58) Field of Search ................ 326/68–74, 83

(56) References Cited

U.S. PATENT DOCUMENTS

| 5,387,828 A | 2/1995 | Nakano |
| 6,501,298 B1 * | 12/2002 | Terletzki ...................... 326/68 |
| 6,664,943 B1 | 12/2003 | Nakajima et al. ............. 345/98 |

FOREIGN PATENT DOCUMENTS

TW    461180    6/2000

* cited by examiner

*Primary Examiner*—Daniel Chang
(74) *Attorney, Agent, or Firm*—Ladas & Parry LLP

(57) ABSTRACT

A level-shifting circuit comprising an enable circuit is disclosed. The level modulating circuit includes an input terminal and an inverse input terminal for respectively receiving a complementary pair of small signals, and a first output terminal for outputting a voltage level in response to the complementary pair of small signals. The enable circuit is coupled to the first output terminal and makes the first output terminal output a predetermined voltage level signal when receiving a disable signal.

12 Claims, 3 Drawing Sheets

LEVEL-SHIFTING CIRCUIT

BACKGROUND OF THE INVENTION

The present invention relates in general to a level-shifting circuit. In particular, the present invention relates to a level-shifting circuit comprising an enable circuit.

DESCRIPTION OF THE RELATED ART

Level-shifting circuits adjust the input voltage level for specific units. FIG. 1 shows a circuit diagram of a conventional level-shifting circuit disclosed in U.S. Pat. No. 5,387,828. The conventional level-shifting circuit selectively outputs low voltage level or high voltage level according to the voltage levels of a complementary pair of small signals Vin and XVin.

The conventional level-shifting circuit comprises PMOS transistors P1 and P1', whose sources are coupled to a first power source VDD (9V as an example) with gates respectively coupled to the complementary pair of small signals Vin and XVin (3.3V swing as an example). The gates of the NMOS transistors N1 and N1' are coupled to the first power source VDD. The sources of the NMOS transistors N1 and N1' are respectively coupled to the complementary pair of small signals Vin and XVin. In addition, the drains of the NMOS transistor N1 and the PMOS transistor P1 are connected, where the connection point is the output terminal XVout and the drain of the NMOS transistors N1' and the PMOS transistor P1' are connected, where the connection point is the output terminal Vout. The output terminals Vout and XVout are respectively connected to the inverters 10A and 10B, which are used as buffers to output responding voltage levels.

Here, the voltage level XVin is reversed to Vin. When Vin is at 3.3V, XVin is at 0V. FIG. 2 shows the simulated transfer characteristics of the level shifter with transistor threshold voltage of 3.5V. The inverters 10A and 10B stabilize the output voltage level of the level-shifting circuit. The inverter 10A outputs a high voltage level signal when the voltage level of the output terminal Vout is lower than the threshold voltage of the inverter 10A; the inverter 10A outputs a low voltage level signal when the voltage level of the output terminal Vout exceeds the threshold voltage of the inverter 10A, where the threshold voltage is about 4.5V in the above simulation. Similarly, the inverter 10B outputs a high voltage level signal when the voltage level of the output terminal Vout is lower than the threshold voltage of the inverter 10B; the inverter 10B outputs a low voltage level signal when the voltage level of the output terminal Vout exceeds the threshold voltage of the inverter 10B.

However, the NMOS transistors N1 and N1' are always turned on because their gates are coupled to the power source VDD, if the level-shifting circuit only operates in a predetermined period where the complementary pair of small signals Vin and XVin are only pulses in the predetermined period, error operation of the level-shifting circuit occurs when the sources of the NMOS transistors N1 and N1' meet noise in the standby period. Another disadvantage is that during the standby period, the level-shifting circuit consumes static power dissipation.

SUMMARY OF THE INVENTION

The object of the present invention is to provide a level-shifting circuit comprising an enable circuit to prevent interference to the level-shifting circuit by external noise during the standby period.

To achieve the above-mentioned object, the present invention provides a level-shifting circuit. The level modulating circuit includes an input terminal and an inverse input terminal for respectively receiving a complementary pair of small signals, and a first output terminal for outputting a voltage level in response to the complementary pair of small signals. The enable circuit is coupled to the first output terminal and makes the first output terminal output a predetermined voltage level signal when receiving a disable signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The level-shifting circuit according, to the present invention comprises a level modulating circuit and an enable circuit. The enable circuit is connected to an output terminal of the level modulating circuit to control the level of the signal output by the level modulating circuit. The level modulating circuit comprises an input terminal and an inverse input terminal for receiving a complementary pair of small signals respectively, and an output terminal for outputting a predetermined voltage level in response to the level of the received complementary pair of small signals. In the first and second embodiments of the present invention, the circuit of the level modulating circuit can be different types. The enable circuit is coupled to the output terminal of any type of level modulating circuit to prevent the output of the level modulating circuit from interference due to external noise.

Figure 1:
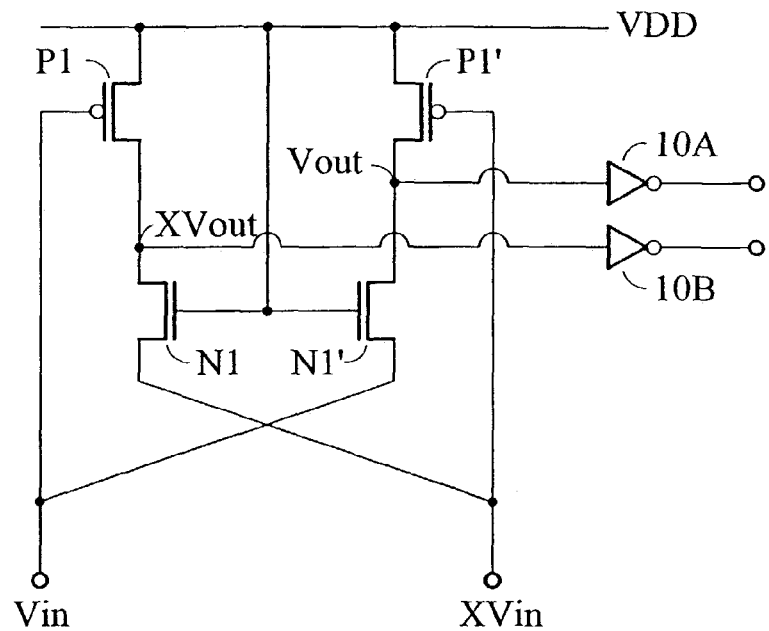
FIG. 1 shows a circuit diagram of a conventional level-shifting circuit.
Figure 2:
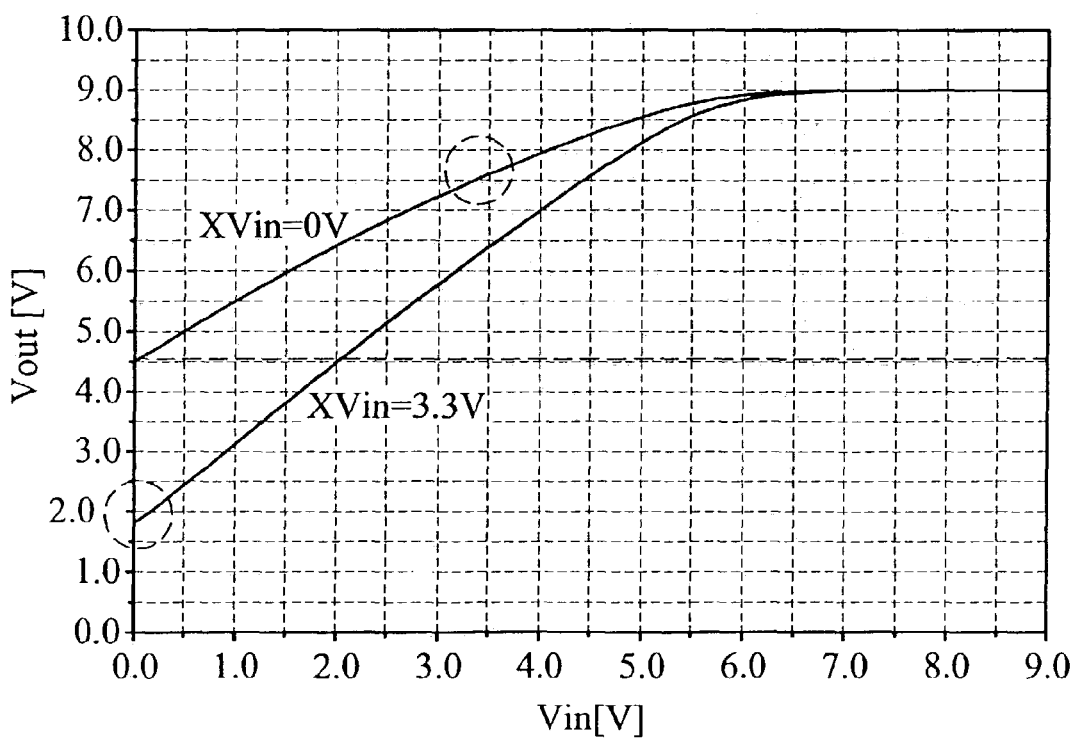
FIG. 2 shows the simulated transfer characteristics of the level-shifting circuit in FIG. 1.

The circuit of the enable circuit and the connection between the enable circuit and the level modulating circuit is described in the following embodiments, wherein the circuit of the level modulating circuit is shown in FIG. 1 as an example.

First Embodiment

Figure 3:
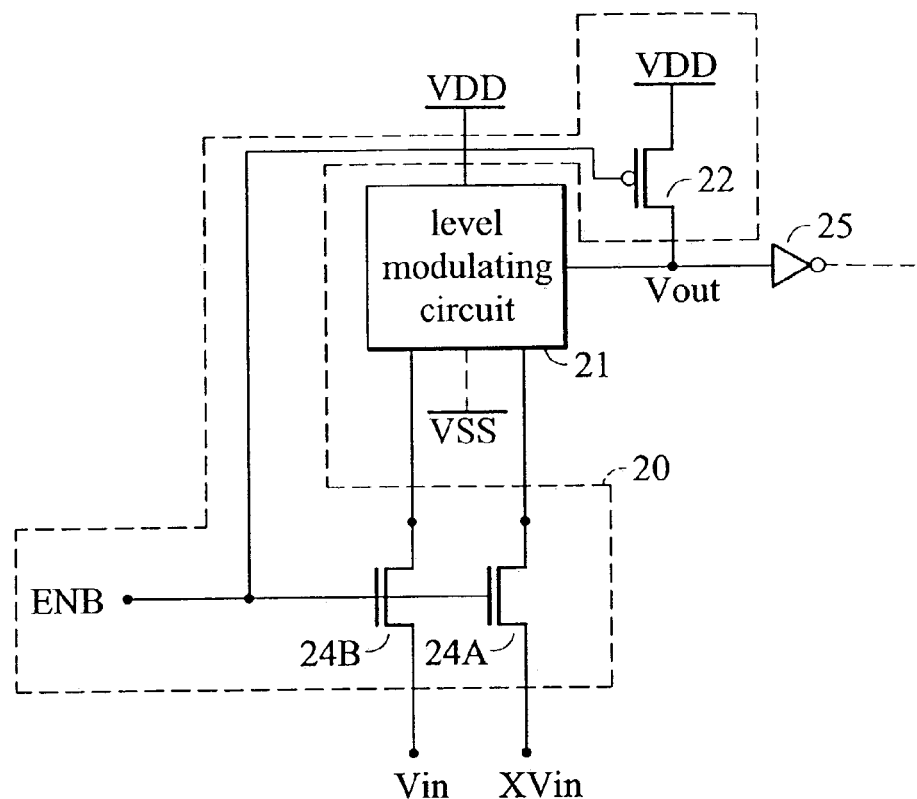
FIG. 3 shows a level-shifting circuit according to the first embodiment of the present invention.

FIG. 3 shows a level-shifting circuit according to the first embodiment of the present invention. The enable circuit 20 comprises a PMOS transistor 22, its source is coupled to the voltage VDD and its drain is coupled to the output terminal Vout of the level modulating circuit 21. In addition, the gate of the PMOS transistor 22 is coupled to an enable signal ENB. The drains of the NMOS transistors 24A and 24B are respectively coupled to the signal input terminal of the level modulating circuit 21. The sources of the NMOS transistors 24A and 24B are respectively coupled to the complementary pair of small signals Vin and XVin, and the gates of the NMOS transistors 24A and 24B are coupled to the enable signal ENB.

The NMOS transistors 24A and 24B are turned on and the PMOS transistor 22 is turned off when the enable signal ENB is at high voltage level. Thus, the level modulating circuit 21 receives the complementary pair of small signals Vin and XVin output from the NMOS transistors 24A and 24B and the operation is the same with the conventional level-shifting circuit.

The NMOS transistors 24A and 24B are turned off and the PMOS transistor 22 is turned on when the enable signal ENB is at low voltage level. Here, the enable signal ENB at low voltage represents a disable signal. Thus, the level modulating circuit 21 is unable to receive the complementary pair of small signals Vin and XVin to prevent the output of the level modulating circuit 21 from interference due to the noise of the complementary pair of small signals Vin and XVin. In addition, the output voltage Vout of the level modulating circuit 21 maintains high voltage level when PMOS transistor 22 is turned on. In addition, the output voltage Vout is inverted to a low voltage level by the inverter 25, which is a standard level output from the level-shifting circuit in standby-mode (disable mode). Thus, the interference of the output of the level-shifting circuit causing by the noise received by the sources of the NMOS transistors 24A and 24B is eliminated.

Second Embodiment

Figure 4:
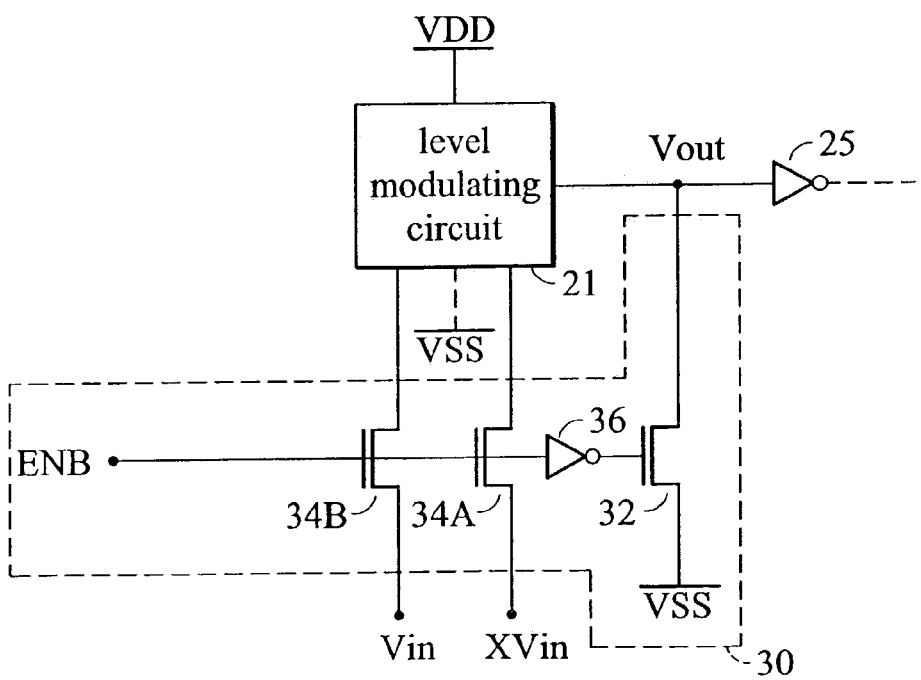
FIG. 4 shows a level-shifting circuit according to the second embodiment of the present invention.

FIG. 4 shows a level-shifting circuit according to the second embodiment of the present invention. The enable circuit 30 comprises a NMOS transistor 32, its source is coupled to the ground level and its drain is coupled to the output terminal Vout of the level modulating circuit 21. The drains of the NMOS transistors 34A and 34B are respectively coupled to the signal input terminal of the level modulating circuit 21. The sources of the NMOS transistors 34A and 34B are respectively coupled to the complementary pair of small signals Vin and XVin, and the gates of the NMOS transistors 34A and 34B are coupled to the enable signal ENB, and coupled to the gate of the NMOS transistor 32 through the inverter 36.

The NMOS transistors 34A and 34B are turned on and the NMOS transistor 32 is turned off when the enable signal ENB is at high voltage level. Thus, the level modulating circuit 21 receives the complementary pair of small-signals Vin and XVin output from the NMOS transistors 34A and 34B and the operation is the same with the conventional level-shifting circuit.

The NMOS transistors 34A and 34B are turned off and the NMOS transistor 32 is turned on when the enable signal ENB is at low voltage level. Here, the enable signal ENB at low voltage represents a disable signal. Thus, the level modulating circuit 21 is unable to receive the complementary pair of small signals Vin and XVin to prevent the output of the level modulating circuit 21 from interference due to the noise of the complementary pair of small signals Vin and XVin. In addition, the output voltage Vout of the level modulating circuit 21 keeps at low voltage level when NMOS transistor 32 is turned on. In addition, the output voltage Vout is inverted to a high voltage level by the inverter 25, which is a standard level output from the level-shifting circuit in standby mode (disable mode) Thus, the interference of the output of the level-shifting circuit causing by the noise received by the sources of the NMOS transistors 34A and 34B is eliminated.

Third Embodiment

Figure 5:
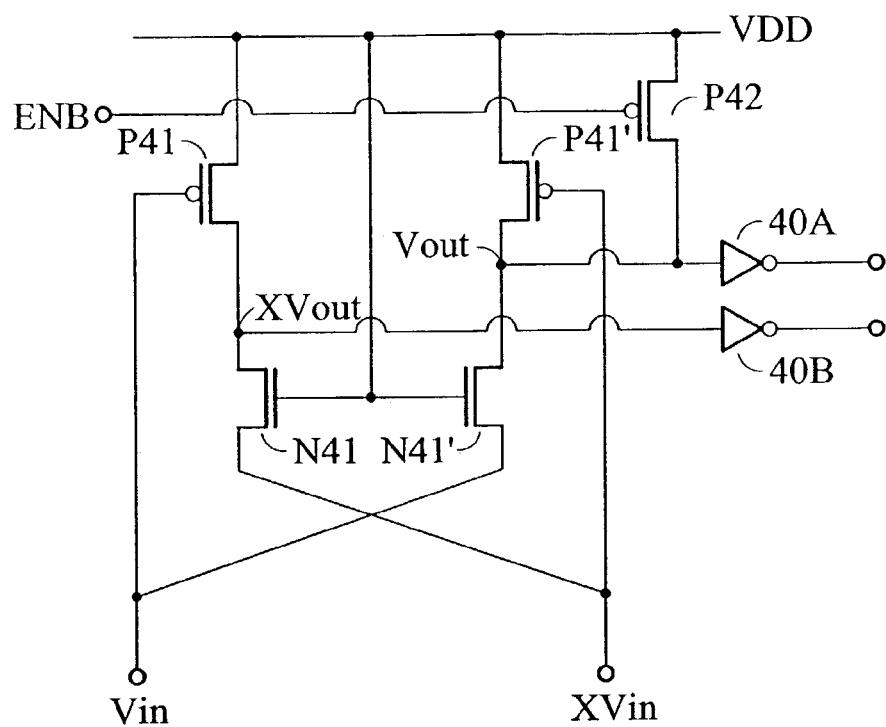
FIG. 5 shows a level-shifting circuit according to the third embodiment of the present invention.

FIG. 5 shows a level-shifting circuit according to the third embodiment of the present invention. The level-shifting circuit according to the third embodiment of the present invention comprises PMOS transistors P41 and P41', whose sources are coupled to a first power source VDD (9V as an example) with gates respectively coupled to the complementary pair of small signals Vin and XVin. The gates of the NMOS transistors N41 and N41' are coupled to the first power source VDD. The sources of the NMOS transistors N41 and N41' are respectively coupled to the complementary pair of small signals Vin and XVin. In addition, the drains of the NMOS transistor N41 and the PMOS transistor P41 are connected, where the connection point is the output terminal XVout and the drains of the NMOS transistors N41' and the PMOS transistor P41' are connected, where the connection point is the output terminal Vout. The output terminals Vout and XVout are respectively connected to the inverters 40A and 40B, which are used as buffers to output responding voltage levels. The drain of the PMOS transistor P42 is coupled to the output terminal Vout of the level-shifting circuit. The source of the PMOS transistor P42 is coupled to the voltage VDD and the gate of the PMOS transistor P42 is coupled to the enable signal ENB. Here, the PMOS transistor P42 has the largest width/length ratio of all the transistors of the level-shifting circuit.

When the enable signal ENB is at high voltage level (9V as an example), the PMOS transistor P42 is turned off and the level-shifting circuit operates normally. When the enable signal ENB is at low voltage level (0V as an example), the PMOS transistor P42 is turned on and Vout of the level-shifting circuit is pulled up higher than the threshold voltage of the subsequent inverter 40A.

Thus, the inverter 40A outputs a low voltage level signal, which is a standard level output from the level-shifting circuit in standby mode (disable mode). Thus, the interference of the output of the level-shifting circuit caused by noise received by sources of the NMOS transistors N41 and N41' is eliminated.

Fourth Embodiment

Figure 6:
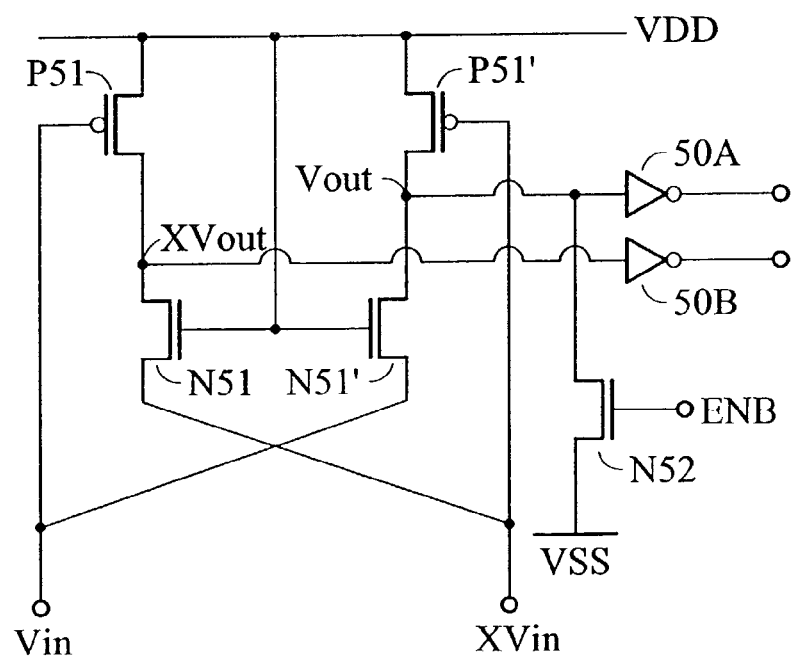
FIG. 6 shows a level-shifting circuit according to the fourth embodiment of the present invention.

FIG. 6 shows a level-shifting circuit according to the fourth embodiment of the present invention. The level-shifting circuit according to the fourth embodiment of the present invention comprises PMOS transistors P51 and P51', whose sources are coupled to a first power source VDD (9V as an example) with gates respectively coupled to the complementary pair of small signals Vin and XVin (3.3V swing as an example). The gates of the NMOS transistors N51 and N51' are coupled to the first power source VDD. The sources of the NMOS transistors N51 and N51' are respectively coupled to the complementary pair of small signals Vin and XVin. In addition, the drains of the NMOS transistor N51 and the PMOS transistor P51 are connected, where the connection point is the output terminal XVout and the drains of the NMOS transistors N51' and the PMOS transistor P51' are connected, where the connection point is the output terminal Vout. The output terminals Vout and XVout are respectively connected to the inverters 50A and 50B, which are used as buffers to output responding voltage levels. The drain of the NMOS transistor N52 is coupled to the output terminal Vout of the level-shifting circuit. The source of the NMOS transistor N52 is coupled to the ground level VSS and the gate of the NMOS transistor N52 is coupled to the enable signal ENB. Here, the NMOS transistor N52 has the largest width/length ratio of all the transistors of the level-shifting circuit.

When the enable signal ENB is at low voltage level (0V as an example), the NMOS transistor N52 is turned off and the level-shifting circuit operates normally. When the enable signal ENB is at high voltage level (9V as an example), the NMOS transistor N52 is turned on and Vout of the level-shifting circuit is pulled down lower than the threshold voltage of the subsequent inverter 50A.

Thus, the inverter 50A outputs a high voltage level signal, which is a standard level output from the level-shifting circuit in standby mode (disable mode). Thus, interference of the output of the level-shifting circuit caused by noise received by sources of the NMOS transistors N51 and N51' is eliminated.

In addition, according to the embodiments of the present invention, the enable circuit is selectively connected to the output terminals Vout or XVout depend on the circuit requirement. Usually, the enable circuit is connected between the output terminal of the level-shifting circuit and others circuit. In addition, the MOS transistors described in the embodiments of the present invention can be replaced with thin film transistors. In addition, the enable circuit is able to disable the operation of the level-shifting circuit and makes the level-shifting circuit outputs a predetermined level signal in standby mode. Thus, the output signal of the level-shifting circuit is not interfered with by the noise when the level-shifting circuit is disabled.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A level-shifting circuit, comprising:
a level modulating circuit having an input terminal and an inverse input terminal for respectively receiving a complementary pair of small signals, and a first output terminal for outputting a voltage level in response to the complementary pair of small signals, wherein the level modulating circuit comprises:
a first PMOS transistor having a first gate coupled to the input terminal, a first source coupled to a power source and a first drain as the second output terminal;
a second PMOS transistor having a second gate coupled to the inverse input terminal, a second source coupled to the power source and a second drain as the first output terminal;
a first NMOS transistor having a third gate coupled to the power source, a third drain coupled to the first drain and a third source as the inverse input terminal; and
a second NMOS transistor having a fourth gate coupled to the power source, a fourth drain coupled to the second drain and a fourth source as the input terminal; and
an enable circuit making the first output terminal output a predetermined voltage level signal when receiving a disable signal, wherein the enable circuit comprises:
a MOS transistor having a fifth source and a fifth drain coupled between an external level and one of the first output terminal and the second output terminal, and a fifth gate coupled to the disable signal; and
a pair of third NMOS transistors having sixth drains respectively coupled to the input terminal and the inverse input terminal, sixth sources coupled to the complementary pair of small signals, and sixth gates coupled to the disable signal.

2. The level-shifting circuit as claimed in claim 1, wherein the MOS transistor is a third PMOS transistor having the fifth source coupled to the power source, and the fifth drain coupled to the first output terminal.

3. The level-shifting circuit as claimed in claim 2, wherein the enable circuit further comprises an inverter coupled between the gates of the third and fourth NMOS transistors.

4. The level-shifting circuit as claimed in claim 1, wherein the MOS transistor is a fourth NMOS transistor having the fifth source coupled to a ground level, and the fifth drain coupled to one of the first output terminal and the second output terminal.

5. The level-shifting circuit as claimed in claim 1, wherein said predetermined voltage level signal is fixed.

6. A level-shifting circuit, comprising:
a level modulating circuit having a first input terminal for receiving a reference signal and a second input terminal for receiving a modulating signal, and an output terminal for outputting a voltage level in response to the level of the modulating signal, wherein the level modulating circuit comprises:
a first PMOS transistor having a first gate coupled to the input terminal, a first source coupled to a power source and a first drain as the second output terminal;
a second PMOS transistor having a second gate coupled to the inverse input terminal, a second source coupled to the power source and a second drain as the first output terminal;
a first NMOS transistor having a third gate coupled to the power source, a third drain coupled to the first drain and a third source as the inverse input terminal; and
a second NMOS transistor having a fourth gate coupled to the power source, a fourth drain coupled to the second drain and a fourth source as the input terminal; and
an enable circuit making the output terminal output a predetermined voltage level signal when receiving a disable signal, wherein the enable circuit comprises:
a thin film transistor (TFT) having a fifth source and a fifth drain coupled between an external level and the output terminal, and a fifth gate coupled to the disable signal; and
a pair of first N-type thin film transistors having sixth drains respectively coupled to the first and second input terminals, sixth sources respectively receiving the reference signal and the modulating signal, and sixth gates coupled to the disable signal.

7. The level-shifting circuit as claimed in claim 6, wherein the thin film transistor is a first P-type thin film transistor having the fifth source coupled to a power source, and the fifth drain coupled to the first output terminal.

8. The level-shifting circuit as claimed in claim 6, wherein the thin film transistor is a second N-type thin film transistor having the fifth source coupled to a ground level, and the fifth drain coupled to the first output terminal.

9. The level-shifting circuit as claimed in claim 8, wherein the enable circuit further comprises an inverter coupled between the gates of the first N-type thin film transistors and the second N-type thin film NMOS transistor.

10. The level-shifting circuit as claimed in claim 6, wherein said predetermined voltage level signal is fixed.

11. A level-shifting circuit, comprising:

a level modulating circuit having an input terminal and an inverse input terminal for respectively receiving a complementary pair of signals, and a first output terminal for outputting a first voltage level in response to the complementary pair of signals, wherein the level modulating circuit comprises:

a first PMOS transistor having a first gate coupled to the input terminal, a first source coupled to a power source and a first drain as the second output terminal;

a second PMOS transistor having a second gate coupled to the inverse input terminal, a second source coupled to the power source and a second drain as the first output terminal;

a first NMOS transistor having a third gate coupled to the power source, a third drain coupled to the first drain and a third source as the inverse input terminal; and a second NMOS transistor having a fourth gate coupled to the power source, a fourth drain coupled to the second drain and a fourth source as the input terminal; and an enable circuit causing the first output terminal to output a second voltage level signal independent of the first voltage level, wherein the enable circuit comprises:

a MOS transistor having a fifth source and a fifth drain coupled between an external level and the first output terminal, and a fifth gate coupled to a disable signal; and a pair of third NMOS transistors having sixth drains respectively coupled to the input terminal and the inverse input terminal, sixth sources coupled to the complementary pair of signals, and sixth gates coupled to the disable signal.

12. The level-shifting circuit as claimed in claim 11, wherein the MOS transistor is a third PMOS transistor having the fifth source coupled to the power source, and the fifth drain coupled to the first output terminal.

* * * * *